US012614583B2

(12) United States Patent
Muchherla et al.

(10) Patent No.:  US 12,614,583 B2
(45) Date of Patent:       Apr. 28, 2026

(54) CONCURRENT SCAN OPERATION ON MULTIPLE BLOCKS IN A MEMORY DEVICE

(71) Applicant: MICRON TECHNOLOGY, INC., Boise, ID (US)

(72) Inventors: Kishore Kumar Muchherla, San Jose, CA (US); Junwyn A. Lacsao, Folsom, CA (US); Jeffrey S. McNeil, Nampa, ID (US); Violante Moschiano, Avezzano (IT); Paing Z. Htet, Union City, CA (US); Sead Zildzic, Folsom, CA (US); Eric N. Lee, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 309 days.

(21) Appl. No.: 18/083,077

(22) Filed: Dec. 16, 2022

(65) Prior Publication Data

US 2023/0206992 A1     Jun. 29, 2023

Related U.S. Application Data

(60) Provisional application No. 63/294,754, filed on Dec. 29, 2021.

(51) Int. Cl.
G11C 11/4091       (2006.01)
G11C 11/4093       (2006.01)
G11C 11/4099       (2006.01)

(52) U.S. Cl.
CPC ...... G11C 11/4091 (2013.01); G11C 11/4093 (2013.01); G11C 11/4099 (2013.01)

(58) Field of Classification Search
CPC .. G06F 11/08; G06F 11/1004; G06F 11/1048; G06F 11/1076; G06F 3/0619; G11C 11/4091; G11C 11/4093; G11C 11/4099; G11C 16/08; G11C 16/26; G11C 16/3427; G11C 16/0483; G11C 16/24
See application file for complete search history.

(56) References Cited

U.S. PATENT DOCUMENTS

| | | | | |
|---|---|---|---|---|
| 8,792,293 B2 * | 7/2014 | Singh | ................. | G11C 11/4091 |
| | | | | 365/208 |
| 9,053,808 B2 * | 6/2015 | Sprouse | ................ | G11B 20/18 |
| 10,535,401 B2 * | 1/2020 | Lin | ........................ | G11C 29/52 |
| 10,553,290 B1 * | 2/2020 | Muchherla | ......... | G11C 16/3418 |
| 10,658,054 B2 * | 5/2020 | Ioannou | ............. | G11C 16/3427 |
| 11,158,384 B1 * | 10/2021 | Yabe | ...................... | G11C 16/26 |

(Continued)

*Primary Examiner* — Han Yang
*Assistant Examiner* — Christopher Lane Reece
(74) *Attorney, Agent, or Firm* — Lowenstein Sandler LLP

(57) ABSTRACT

Control logic in a memory device selects two or more blocks of a plurality of blocks to concurrently scan during a scan operation. The control logic can further cause a first voltage to be applied to a dummy word line of each block of the two or more blocks to selectively couple a string of memory cells in each block of the two or more blocks to a different sense amplifier of a set of sense amplifiers coupled with the plurality of blocks. The control logic can cause a second voltage to be applied to a selected word line of each block of the two or more blocks to read a bit stored at a respective memory cell of the string of memory cells in each block out to the set of sense amplifier.

19 Claims, 7 Drawing Sheets

300

| Page Buffer 310 | | | | |
|---|---|---|---|---|
| | Logical Segment 315-a | Logical Segment 315-b | Logical Segment 315-c | Logical Segment 315-d |
| Block 305-a — Dummy WL 320-a | Low Vt | High Vt | High Vt | High Vt |
| Block 305-a — Selected WL 330-a | | Memory Cell 308 | | |
| Block 305-b — Dummy WL 320-b | High Vt | Low Vt | High Vt | High Vt |
| Block 305-b — Selected WL 330-b | String of Memory Cells 306 | | | |
| Block 305-c — Dummy WL 320-c | High Vt | High Vt | Low Vt | High Vt |
| Block 305-c — Selected WL 330-c | | | | |
| Block 305-d — Dummy WL 320-d | High Vt | High Vt | High Vt | Low Vt |
| Block 305-d — Selected WL 330-d | | | | |

Unselected Wordlines 325

(56)        References Cited

U.S. PATENT DOCUMENTS

| 11,488,657 | B1 * | 11/2022 | Huang | ................ G11C 11/5642 |
| 2009/0135656 | A1 * | 5/2009 | Park | .................... G11C 29/028 |
| | | | | 365/185.29 |

* cited by examiner

Figure 3:
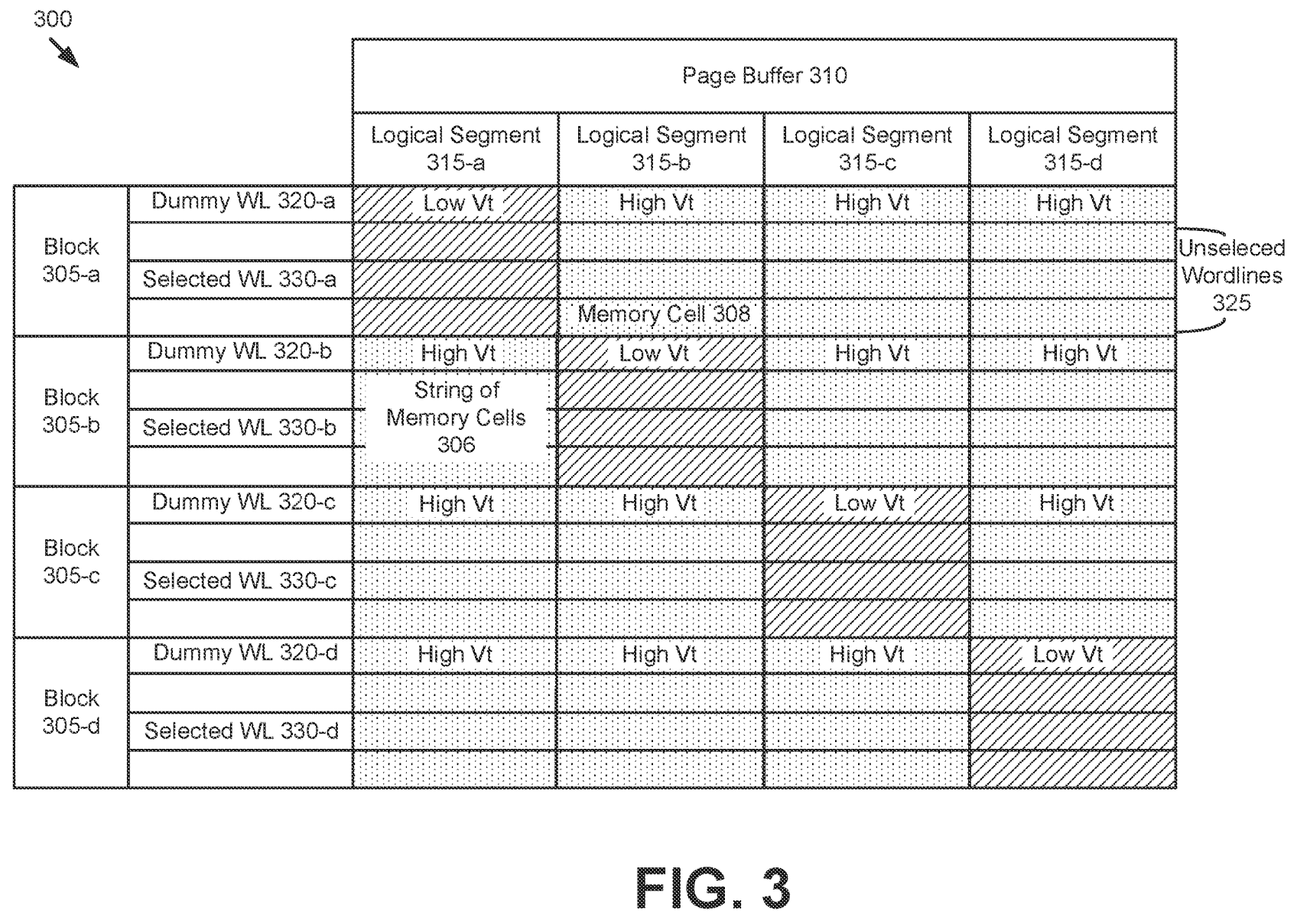

300

Page Buffer 310

| | Logical Segment 315-a | Logical Segment 315-b | Logical Segment 315-c | Logical Segment 315-d |
|---|---|---|---|---|
| Dummy WL 320-a | Low Vt | High Vt | High Vt | High Vt |
| Selected WL 330-a | | | | |
| Dummy WL 320-b | High Vt | Low Vt | High Vt | High Vt |
| Selected WL 330-b | | | | |
| Dummy WL 320-c | High Vt | High Vt | Low Vt | High Vt |
| Selected WL 330-c | | | | |
| Dummy WL 320-d | High Vt | High Vt | High Vt | Low Vt |
| Selected WL 330-d | | | | |

Block 305-a

Block 305-b

Block 305-c

Block 305-d

Memory Cell 308

String of Memory Cells 306

Unseleced Wordlines 325

PROGRAM TRANSISTORS COUPLED WITH
DUMMY WORD LINE 505

SELECT TWO OR MORE BLOCKS FOR SCAN
OPERATION 510

CAUSE A FIRST VOTLAGE TO BE APPLIED TO
DUMMY WORD LINE 515

CAUSE A SECOND VOLTAGE TO BE APPLIED TO
SELECTED WORD LINE 520

PERFORM SCAN OPERATION 525

CONCURRENT SCAN OPERATION ON MULTIPLE BLOCKS IN A MEMORY DEVICE

RELATED APPLICATION

This application claims the benefit of U.S. Provisional Application 63/294,754 filed on Dec. 29, 2021, the entire content of which is incorporated by reference herein.

TECHNICAL FIELD

Embodiments of the disclosure relate generally to memory sub-systems, and more specifically, relate to a concurrent scan operation on multiple blocks in a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 is a schematic of portions of an array of memory cells implementing a concurrent scan operation on multiple blocks in a memory device, in accordance with some embodiments of the present disclosure.

DETAILED DESCRIPTION

Figure 1A:
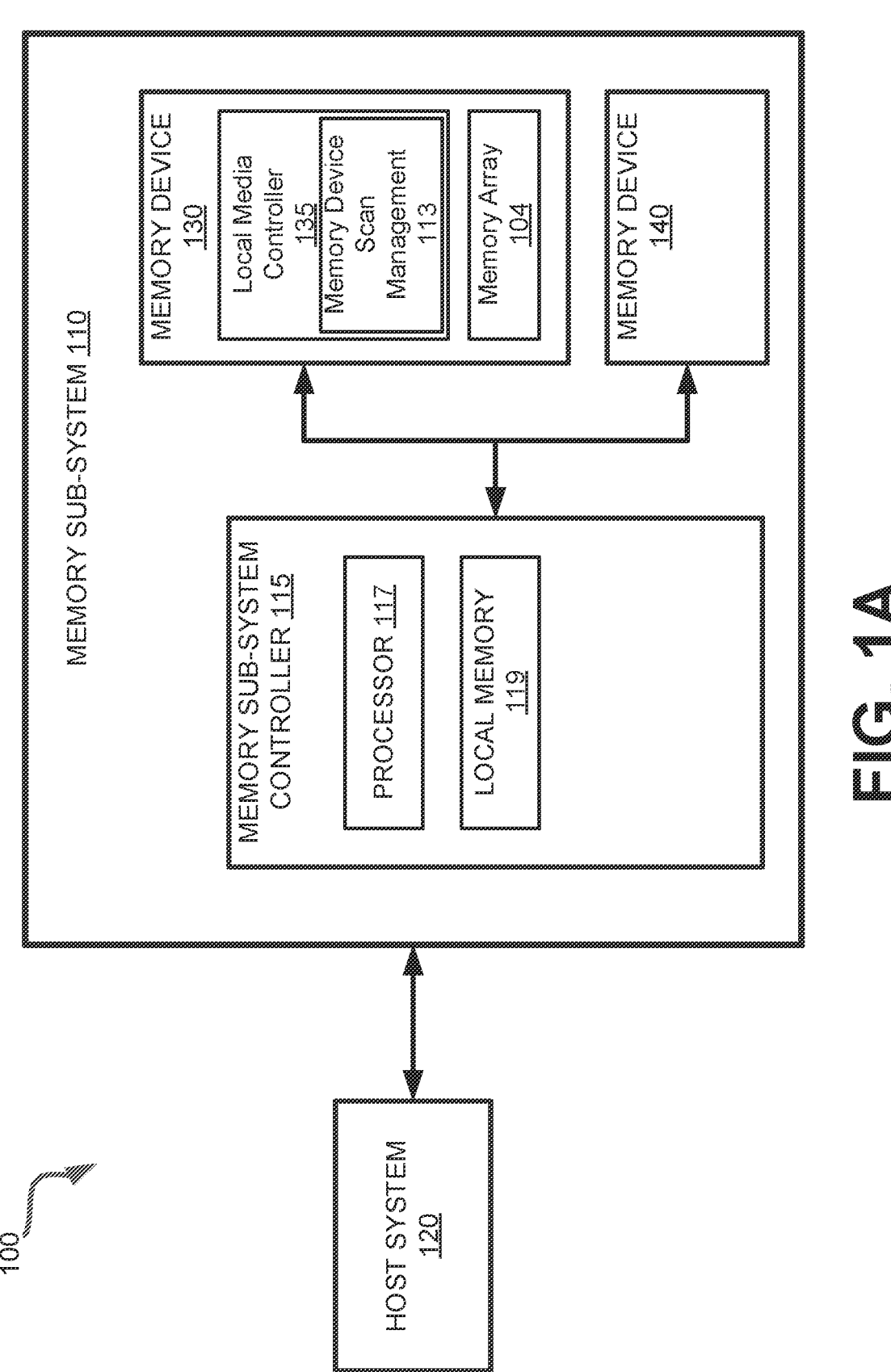
FIG. 1A illustrates an example computing system that includes a memory sub-system, in accordance with some embodiments of the present disclosure.

Aspects of the present disclosure are directed to a concurrent scan operation on multiple blocks in a memory device of a memory sub-system. A memory sub-system can be a storage device, a memory module, or a combination of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bit lines) and rows (also hereinafter referred to as word lines). A word line can refer to one or more rows of memory cells of a memory device that are used with one or more bit lines to generate the address of each of the memory cells. The intersection of a bit line and word line constitutes the address of the memory cell. A block hereinafter refers to a unit of the memory device used to store data and can include a group of memory cells, a word line group, a word line, or individual memory cells. One or more blocks can be grouped together to form separate partitions (e.g., planes) of the memory device in order to allow concurrent operations to take place on each plane. Some memory devices can also have multiple memory die (e.g., a group of cells etched on a respective silicon wafer), where each memory die can include a number of planes. Each data block can include a number of sub-blocks, where each sub-block is defined by an associated pillar (e.g., a vertical conductive trace) extending from a shared bit line. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of channel material. The memory cells can be coupled to access lines, which are commonly referred to as "word lines," often fabricated in common with the memory cells, so as to form an array of strings in a block of memory. The compact nature of certain non-volatile memory devices, such as 3D flash NAND memory, means word lines are common to many memory cells within a block of memory.

Certain memory devices can perform concurrent operations on each plane for each memory die. For example, the memory device can read data from a block of each plane from each memory die. In such memory devices, a number of read operations performed concurrently can be limited by a number of planes as every block in a plane shares a common set of sense amplifiers—e.g., a memory device can be limited to four (4) read operations per memory die if there are four (4) planes per a memory die. That is, if data is read from multiple blocks in a plane, the common set of sense amplifiers can receive invalid data from bit lines shared across blocks—e.g., overlapping data from multiple blocks on the bit lines that is not representative of data from any given block. Creating planes (e.g., separate partitions) reduces the area on which memory cells can be etched on each memory die—e.g. the more planes there are, the less area there is to etch memory cells and accordingly the less memory cells there per each memory die. Accordingly, to reduce costs and increase the number of memory cells in a respective die, a number of planes is reduced. For example, as die size increases (e.g., a storage capacity of a memory die increases), the number of planes added does not increase proportionally—i.e., if the storage capacity doubles, the number of planes may increase by a factor of 1.5 rather than also double. This can reduce the number of concurrent read operations the memory device can perform—e.g., reduce a read parallelism of the memory device. Reducing the number of read operations the memory device can perform can reduce performance of the memory device and increase read latencies, especially in the context of scan operations.

The reliability of data stored at a memory cell can decrease over time. For example, a threshold voltage or a threshold distribution of multiple memory cells can shift over time (e.g., voltage threshold drift can occur). Some memory cells can be corrupt or unreadable due to the voltage threshold drift, temperature, or other stresses on the memory cell. Accordingly, the memory device can periodically perform scan operations on blocks to check the reliability of the data stored. For example, the memory device can read a page in a block from each plane to determine if memory cells have shifted logic states or are unreadable, determine error rates, or determine how many bits are allowed to fail before a codeword stored across memory cells is unreadable or corrupted. The scan operation can be an internal operation performed by control logic of the memory device. That is, the memory device can perform periodic scan operations without commands from a host device. In certain instances, the memory device can be performing scan operations as it receives commands from the host device—e.g., the memory device can receive a read command while performing a scan. In such instances, the memory device can complete the scan operation before executing the read command. Accordingly, the memory device read latency (e.g., the time it takes the memory device to perform the read operation) can increase and the overall performance of the system can decrease— e.g., since the host device must wait longer to receive the data requested form the memory device. The read latency increases more as the number of planes is reduced—e.g., as the read parallelism is decreases. That is, as the number of planes is decreased, the number of concurrent scans the memory device can perform is reduced.

Aspects of the present disclosure address the above and other deficiencies by implementing a concurrent scan operation for multiple blocks in a plane of the memory device. In an embodiment, each block of the memory device can include a dummy word line coupled with a number of strings of memory cells in the block. The dummy word line can be a word line that is connected to transistors (e.g., dummy memory cells) in the string of memory cells that do not store user data—e.g., do not store data for a host device. Each string of memory cells in a sub-block can be coupled with a sense amplifier of the common set of amplifiers for the block—e.g., if the sub-block includes four (4) strings of memory cells, each memory string can be coupled to a different sense amplifier of a set of four (4) amplifiers. In some examples, each string of memory cells in the sub-blocks can be coupled with a different logical segment of the set of sense amplifiers. In either case, each sub-block can share the set of amplifiers, even across blocks—e.g., a first sub-block of a first block and a first sub-block of a second block can share the set of sense amplifiers.

The control logic can program the transistors on each dummy word line of each block such that a selected transistor coupled to each dummy word line is programmed at a low threshold voltage while the remaining transistors coupled to the dummy word line are programmed at a high threshold voltage. The transistors can be programmed in a staggered or non-overlapping fashion such that for a set of blocks (e.g., for four blocks if there are four strings of memory cells in a sub-block or sixteen blocks if there are sixteen strings of memory cells) the position of the transistor programmed to the low threshold voltage is different than the other transistors programmed to the low threshold voltage. For example, the control logic can cause a transistor of the first string of memory cells to be programmed to the low threshold voltage at a first sub-block, cause a transistor of a second string of memory cells to be programmed to the low threshold voltage at second sub-block, cause a third transistor of a third string of memory cells to be programmed to the low threshold voltage at a third sub-block, and so forth such that the transistors programmed to the low threshold voltage are on strings of memory cells that do not share a sense amplifier. During a scan operation, the control logic can select the set of blocks from each plane for a scan operation. The control logic can cause a mask voltage to be applied to the dummy word line to activate the transistors programmed to the low threshold voltage and deactivate the transistors programmed to the high threshold voltage. Accordingly, each string of memory cells including the transistor programed to the low threshold voltage can be coupled to a sense amplifier while each string of memory cells including the transistor programmed to the high threshold voltage can be decoupled from the sense amplifier. The control logic can then cause a read voltage to be applied to a selected word line coupled with a respective memory cell each string of memory cells. In some examples, the bits or logic state of the respective memory cell in the string of memory cells including the transistor programed to the low threshold voltage can be read to the sense amplifiers while the bits or logic states of the remaining strings of memory cells are not read to the sense amplifier. Because the transistors are programmed to the low threshold voltage in a staggered fashion, there can be no overlapping data received on each sense amplifier of the set of amplifiers—e.g., a first sense amplifier can receive data from the first string of memory cells in the first sub-block, a second sense amplifier can receive data from the second string of memory cells in the second sub-block, a third sense amplifier can receive data from the third string of memory cells in the third sub-block and so forth. Accordingly, the memory device can concurrently read from the set of blocks (e.g., four, sixteen, or any number of blocks equivalent to the number of sense amplifiers or logical segments). The control logic can repeat this process until all the blocks in each plane have been scanned.

Advantages of this approach include, but are not limited to, improved performance in the memory device and reductions in read latency. The scan operation described herein scans multiple blocks concurrently, reducing the time it takes to complete each scan operation, reduces the power consumption to perform the scan operation, and enables the memory device to calibrate blockers—e.g., blocks after the scan operation can be calibrate to remedy data corruption. By reducing the time of the scan operation, the memory device can reduce a read latency associated with executing a read command for the host device—e.g., the memory device can complete the scan operation quicker and start executing the read command faster. Accordingly, the performance of the memory device can be improved.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory device 130 includes a memory device scan management component 113 that can oversee, control, and/or manage data access operations, such as scan operations, performed on a non-volatile memory device, such as memory device 130, of memory sub-system 110. A scan operation, for example, can include determining reliability of data stored at the memory array 104. In some embodiments, the scan management component 113 can perform the scan operations to determine a number of errors at the memory array 104—e.g., determine a number of bits that flipped logic states (e.g., form '1' to '0' or vice versa) or an error rate associated with blocks of the memory array 104. In some embodiments, the scan management component 113 can calibrate the blocks based on the scan—e.g., calibrate demarcation voltages for reading the memory cells stored at the memory array 104 responsive to determining shifts of voltage distribution thresholds of memory cells.

Scan management component 113 is responsible for causing certain voltages to be applied (or indicating which voltages to apply) to memory device 130 during the scan operation. In one embodiment, scan management component 113 causes a concurrent scan operation to be performed on multiple blocks of the memory array 104. For example, the scan management component 113 can cause transistors in strings of memory cells coupled to a dummy word line of a block to be selectively programmed. For example, the scan management component 113 can cause a low voltage threshold to be programmed to a transistor of one of the strings of memory cells in the block—e.g., one transistor is programmed to the low voltage threshold for each block. In some embodiments, the scan management component 113 can cause the transistors to be programmed in a non-overlapping fashion across multiple blocks. For example, the scan management component 113 can program the transistors such that one transistor is programmed to a low voltage threshold for one string of memory cells coupled to a respective sense amplifier as described with reference to FIGS. 3 and 4. Accordingly, the scan management component 113 can cause a mask voltage to be applied to the dummy word line to activate the transistors programmed to the low voltage threshold and couple the respective strings of memory cells to the sense amplifiers—e.g., each string of memory cells coupled with a different sense amplifier. The scan management component 113 can then apply a read voltage (or a select voltage) and read the data from a respective memory cell of each of the strings of memory cells coupled to the sense amplifier. Accordingly, the scan management component 113 can perform a concurrent scan operation on multiple blocks and reduce the time it takes to perform the scan operation—e.g., improve the performance of the memory device 130, decrease read latencies, decrease the time to calibrate blocks.

In some embodiments, the memory sub-system controller 115 includes at least a portion of program management component 113. For example, the memory sub-system controller 115 can include a processor 117 (e.g., a processing device) configured to execute instructions stored in local memory 119 for performing the operations described herein. In some embodiments, program management component 113 is part of the host system 110, an application, or an operating system. In other embodiment, local media controller 135 includes at least a portion of program management component 113 and is configured to perform the functionality described herein. In such an embodiment, program management component 113 can be implemented using hardware or as firmware, stored on memory device 130, executed by the control logic (e.g., program management component 113) to perform the operations related to program recovery described herein.

Figure 1B:
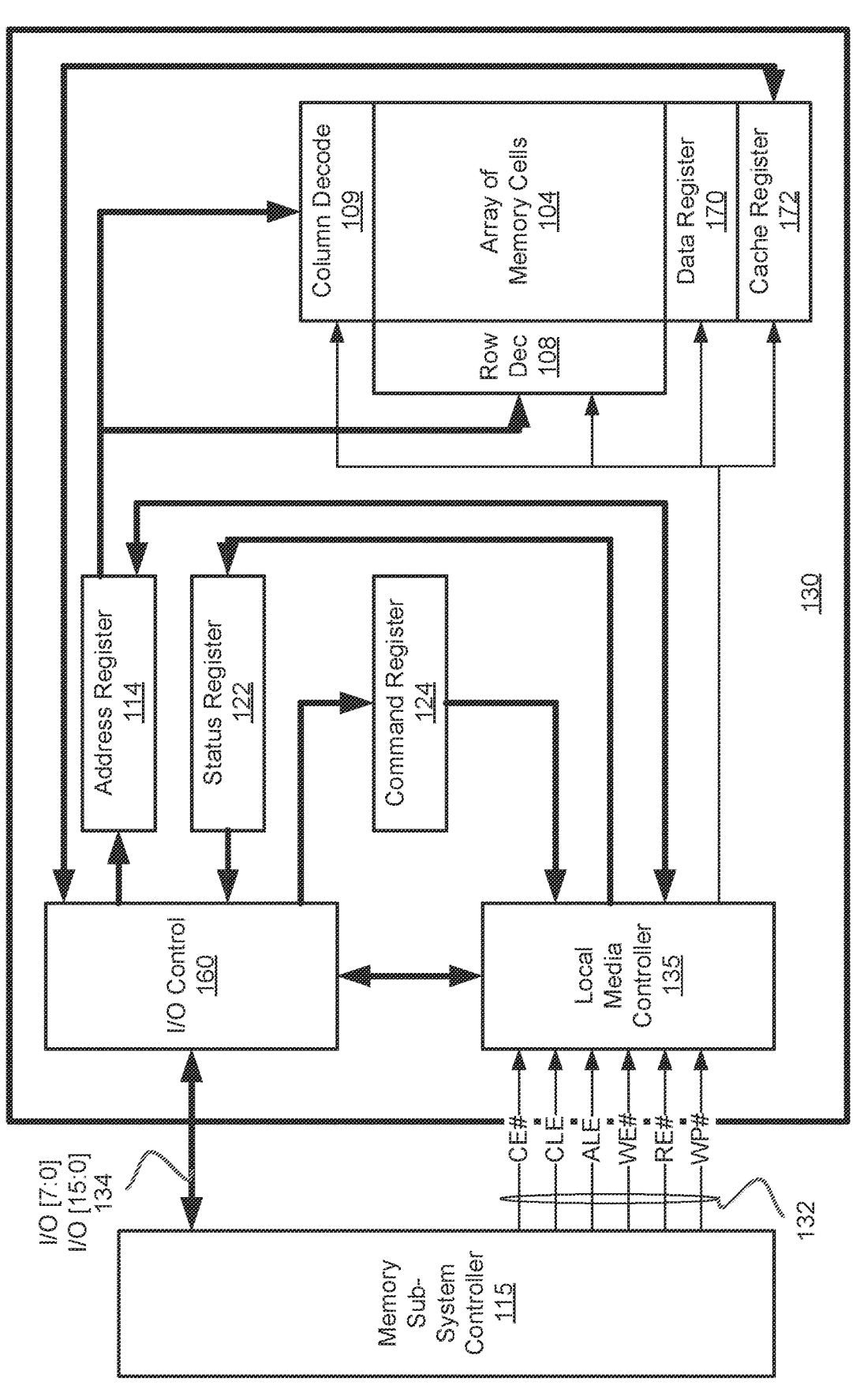
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states. In one embodiment, the array of memory cells 104 (i.e., a "memory array") can include a number of sacrificial memory cells used to detect the occurrence of read disturb in memory device 130, as described in detail herein.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 160 and may then be written into command register 124. The addresses may be received over input/output (I/O) pins [7:0] of I/O bus 236 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
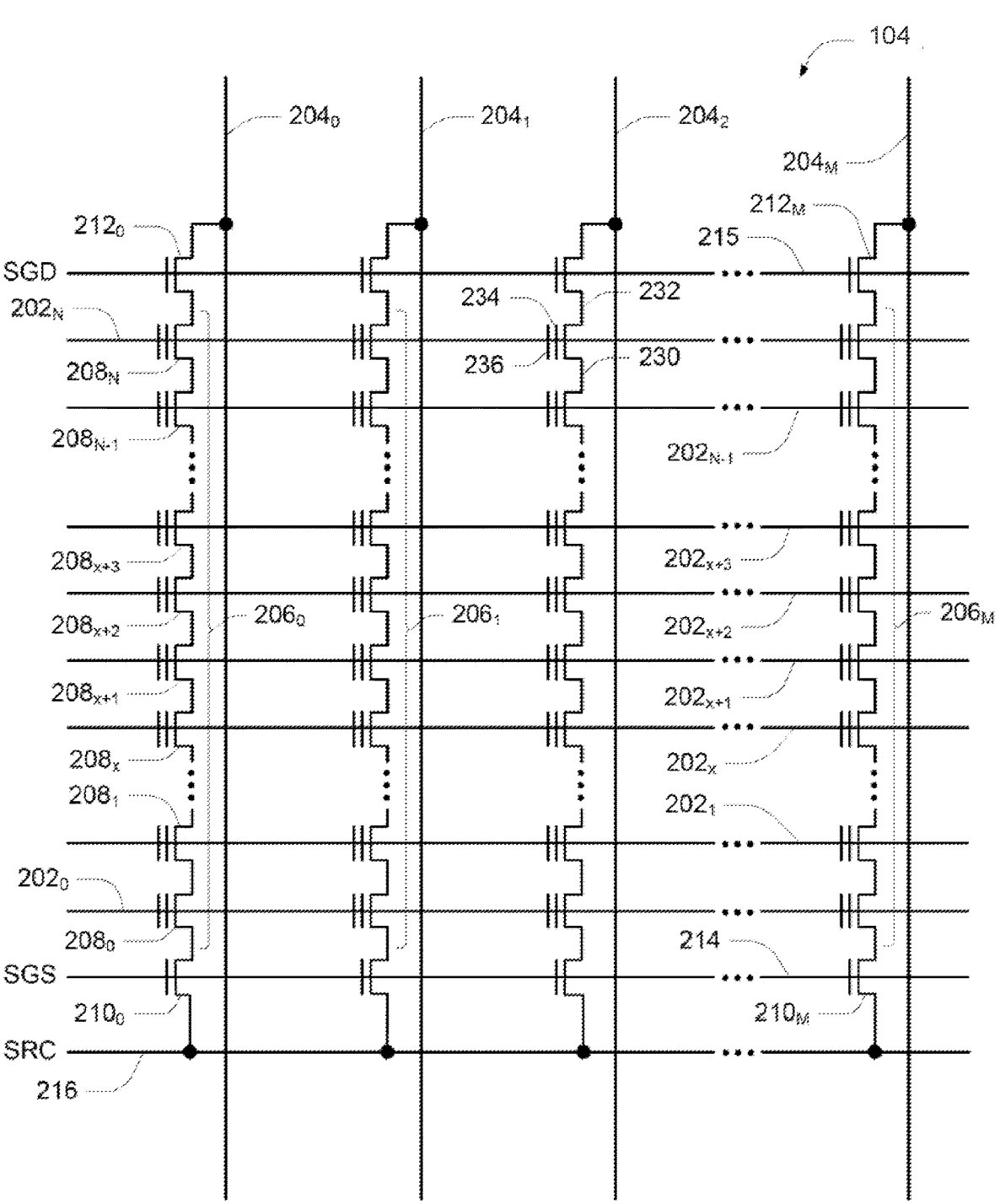
FIG. 2 is a schematic of portions of an array of memory cells as could be used in a memory of the type described with reference to FIG. 1B, in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines $202_0$ to $202_N$, and data lines, such as bit lines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

In one embodiment, one or more of NAND strings 206 can be designated as sacrificial strings and used to detect read disturb in memory array 104. For example, NAND string $206_0$ can be designated a sacrificial string. In other embodiments, there can be different NAND strings or additional NAND strings, including two or more NAND strings, which are designated as sacrificial strings. In one embodiment, NAND string $206_0$ can include at least one sacrificial memory cell 208 from each wordline 202. These sacrificial memory cells 208 in the sacrificial memory string $206_0$ are not made available to the memory sub-system controller, and thus are not used to store host data. Rather, the sacrificial memory cells 208 remain in a default state (e.g., an erased state) or are programmed to a known voltage (e.g., a voltage corresponding to a known state). When a read operation is performed on any of the wordlines in memory array 104, a read voltage is applied to the selected wordline and a pass voltage is applied to the unselected wordlines, and the sacrificial memory cells will experience the same read disturb effects as the memory cells storing host data. When the read disturb effects become strong enough, one or more of the sacrificial memory cells can shift from the default or known state to a different state (e.g., to a state associated with a higher voltage level). Thus, local media controller 135 can perform a string sensing operation on the string of sacrificial memory cells to determine whether read disturb has occurred. In one embodiment, to perform the string sensing operation a predefined read voltage is applied to each wordline 202 concurrently, and the current through the sacrificial string $206_0$ is sensed. If any of the sacrificial memory cells 208 in the sacrificial string $206_0$ has shifted to a different state, the sacrificial string $206_0$ will not conduct and current will not flow. Thus, in such a situation, local media controller 135 can determine that read disturb is present in the block of memory array 104.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to wordline $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 104 can be numbered consecutively from bit line $204_0$ to bit line $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 3 is a schematic of portions of an array of memory cells implementing a concurrent scan operation on multiple blocks in a memory device. The portion of the array of memory cells, such as memory array 104, can be a plane 300, for example. In one embodiment, the plane 300 includes blocks 305 and a page buffer 310. The blocks 305 can include a dummy word line 320, unselected word lines 325 (e.g., word lines not associated with the scan operation), and selected word lines 330 (e.g., word lines associated with the scan operation). In at least one embodiment, the shaded portions in each block can represent a string of memory cells 306 including memory cells 308. The page buffer 310 can be divided in accordance with logical segments 315.

In some embodiments, the plane 300 can include multiple blocks 305. Although four (4) blocks are illustrated, in some embodiments the plane 300 can include any number of blocks 305 different than four (4) blocks—e.g., plane 300 can include one, two, three, four, five . . . 500, or more blocks 305. Each block 305 can include multiple sub-blocks. For example, FIG. 3 can illustrate one sub-block for each block 305—e.g., each sub-block can include four (4) strings of memory cells 308. In some embodiments, each block 305 can include more than one sub-block—e.g., the blocks 305 can include two, three, four, five, or more sub-blocks. Each block 305 can include a dummy word line 320. In some embodiments, the transistors (e.g., memory cells 308 or dummy memory cells) coupled to the dummy word line 320 can store no user data—e.g., the local media controller 135 can cause dummy memory cells coupled to the dummy word line 320 to not store data for a host device coupled to the memory device. In some embodiments, the dummy word line 320 can be a retired word line—e.g., a word line previously coupled to memory cells 308 that stored data but due to too many errors in the memory storing the data have been retired. In some embodiments, the dummy word line 320 can be a normal word line that is coupled to memory cells 308 that do not store data and used for the purposes described herein.

In some embodiments, each sub-block of the block 305 can include a number of strings of memory cells 306 that corresponds to a number of logical segments 315 or based on an amount of data stored at each memory cell 308 of the strings of memory cells 306. For example, in one embodiment the page buffer 310 can be configured to store an amount of data—e.g., 16 kilobytes (KB). That is, each page of the memory device can store the amount of data and the page buffer 310 can be configured to store that amount during a read operation. In some embodiments, the memory cells 308 in the strings of memory cells 306 can store a portion of data for the page—e.g., each memory cell 308 can store an amount corresponding to a number of logical segments 315 of the plane. For example, in the embodiment illustrated in FIG. 3, each sub-block can include four (4) strings of memory cells 306, where each sub-page can store a fourth of the amount of data of the page when there are four (4) logical segments 315—e.g., four (4) KB when the page size is 16 KB. In some embodiments, the page can be segmented differently to have any number of logical segments 315—e.g., the page can be divided into 16 logical segments 315 each associated with one (1) KB of data. In such embodiments, the sub-block can have a number of string of memory cells 306 equivalent to a number of logical segments 315—e.g., 16 strings of memory cells 306 when the page is divided into 16 logical segments 315. In some embodiments, the page buffer 310 can include (or be coupled to) a set of sense amplifiers. In at least one embodiment, the number of sense amplifiers can correspond to the number of logical segments 315—e.g., four (4) sense amplifiers for the embodiment illustrated in FIG. 3 or 16 sense amplifiers when there are 16 logical segments 315.

In some embodiments, the page buffer 310 can be common to each block 305 of the plane 300—e.g., the set of sense amplifiers can be common to each block 305. For example, the first string of memory cells 306 in the block 305-a can be associated with a first sense amplifier for the logical segment 315-a and the first string of memory cells 306 in the block 305-a can also be associated with the first sense amplifier while the second string of memory cells 308 in the blocks 305-a and 305-b can be associated with a second sense amplifier for the logical segment 315-b. In some embodiments, reading data concurrently from the first string of memory cells 306 of the first block 305-a and the second block 305-b can result in invalid data at the first sense amplifier—e.g., the data can be read from the first string of memory cells 306 of the block 305-a and block 305-b to a common bit line and can cause the first sense amplifier to receive data that overlaps and that cannot be processed or read. Accordingly, the memory device can use the method described herein for concurrently scanning multiple blocks 305.

For example, the local media controller 135 can cause one transistor coupled to each dummy word line 320 (e.g., dummy memory cell 308) to be programmed to a low voltage threshold in a non-overlapping pattern for a set of blocks corresponding to a page. In one embodiment, the local media controller 135 can cause the transistor coupled with the dummy word line 320-a in the first string of memory cells 306 for block 305-a, the transistor coupled with the dummy word line 320-b in the second string of memory cells 306, the transistor coupled with the dummy word line 320-c in the third string of memory cells 306 for block 305-c, and the transistor coupled with the dummy word line 320-$d$ in the fourth string of memory cells 306 for the block 305-$d$ to all be programmed to the low voltage threshold. In such embodiments, one (1) transistor is programmed to the low voltage threshold for each logical segment 315 for the set of blocks 305 corresponding to the page buffer 310. That is, the local media controller 135 can program any four (4) transistors coupled with the dummy word line 320 for the set of blocks 305 illustrated so long as each logical segment 315 is associated with just one string of memory cells 306 that has a transistor programmed to the low threshold voltage. The local media controller 135 can program the remaining transistors coupled to the dummy word lines 320 to a high voltage threshold. In embodiments where the page is divided into a different number of logical segments 315, the local media controller 135 can program transistors coupled to the dummy word line 320 in a non-overlapping fashion for a number of blocks equivalent to the number of logical segments 315. For example, if the page is divided into 16 logical segments 315, the local media controller 135 can program a transistor from each of the 16 blocks in a non-overlapping fashion—e.g., such that each of the sixteen logical segments 315 is associated with one string of memory cells 306 that includes the transistor programmed to the low voltage threshold. In some embodiments, the local media controller 135 can program the transistors according to an erase algorithm—e.g., during an erase operation. In some embodiments, the local media controller 135 can program the transistors during a program operation. In some embodiments, the transistors can be programed during a manufacturing process.

After the transistors are programmed in the non-overlapping fashion, the local media controller 135 can perform a scan operation to determine the reliability of data stored at the plane 300. In some embodiments, the local media controller 135 can perform the scan operations periodically in accordance with a programmed schedule, pattern, or algorithm. To initiate the program operation, the local media controller 135 can select blocks 305 to scan—e.g., the local media controller 135 can select all blocks 135 for the scan operation or certain blocks 305. In some embodiments, the local media controller 135 can perform a concurrent scan on a set of blocks 305 associated with a page. For example, the local media controller can select blocks 305-$a$ through 305-$d$ for a first scan operation—e.g., concurrently activate blocks 305-$a$ through 305-$d$. In some embodiments, the local media controller 135 can select less or more blocks 305 based on the logical segments 315. The local media controller can cause a mask voltage (e.g., a first voltage) to be applied to each dummy word line 320 of the set of blocks 305. In some embodiments, the mask voltage can be between the low threshold voltage and the high threshold voltage. Accordingly, by applying the mask voltage, the local media controller 135 can cause the transistors programmed to low threshold voltage (e.g., a threshold voltage less than the mask voltage) to activate and not cause the transistors programmed to the high voltage threshold to activate—e.g., keep deactivated or fail to activate the transistors programmed to the high voltage threshold. In some embodiments, a string of memory cells 306 with a transistor programmed to the high voltage threshold and coupled with the dummy word line 320 can be an open circuit when the respective transistor is deactivated. That is, the string of memory cells 306 can be decoupled from the page buffer 310 and the set of sense amplifiers—e.g., even if another memory cell 308 in the string of memory cells 306 is selected, the deactivated transistor can prevent the data or bits from the memory cell 308 from being read to the coupled bit line or read to the sense amplifier. In some embodiments, a string of memory cells 306 with an active transistor programmed to the low voltage threshold and coupled with the dummy word line 320 can be coupled with a respective bit line and sense amplifier—e.g., data or bits from a respective memory cell 308 in the string of memory cells 306 can be read to the sense amplifier.

After applying the mask voltage to the dummy word lines, the local media controller 135 can cause a select voltage (e.g., second voltage) to be applied to each selected word line 330 of the blocks 305. In some embodiments, although all memory cells 308 coupled with the selected word line 330 can be selected, strings of memory cells 308 including the deactivated transistor can be decoupled from their respective bit lines—e.g., the respective selected memory cells 308 can fail to affect the bit line or the sense amplifier. In such embodiments, data stored at memory cells 308 in strings of memory cells 308 including the active transistor can be read to the sense amplifier—e.g. the data from the memory cell 308 in the first string of memory cells 306 in block 305-$a$, the data from the memory cell 308 in the second string of memory cells 306 in block 305-$b$, the data from the memory cell 308 in the third string of memory cells 306 in block 305-$c$, and the data from the memory cell 308 in the fourth string of memory cells 306 in block 305-$d$ can be read to the sense amplifier. Accordingly, the local media controller 135 can perform a concurrent scan operation on blocks 305-$a$ through 305-$d$—e.g., each sub-block and string of memory cells 306 in a block 305 can face similar stress and media degradation, accordingly a single string of memory cells 306 can be sampled from each block 305 to determine the reliability. By utilizing the concurrent scan operation, the memory device can improve performance and reduce read latencies.

Figure 4:
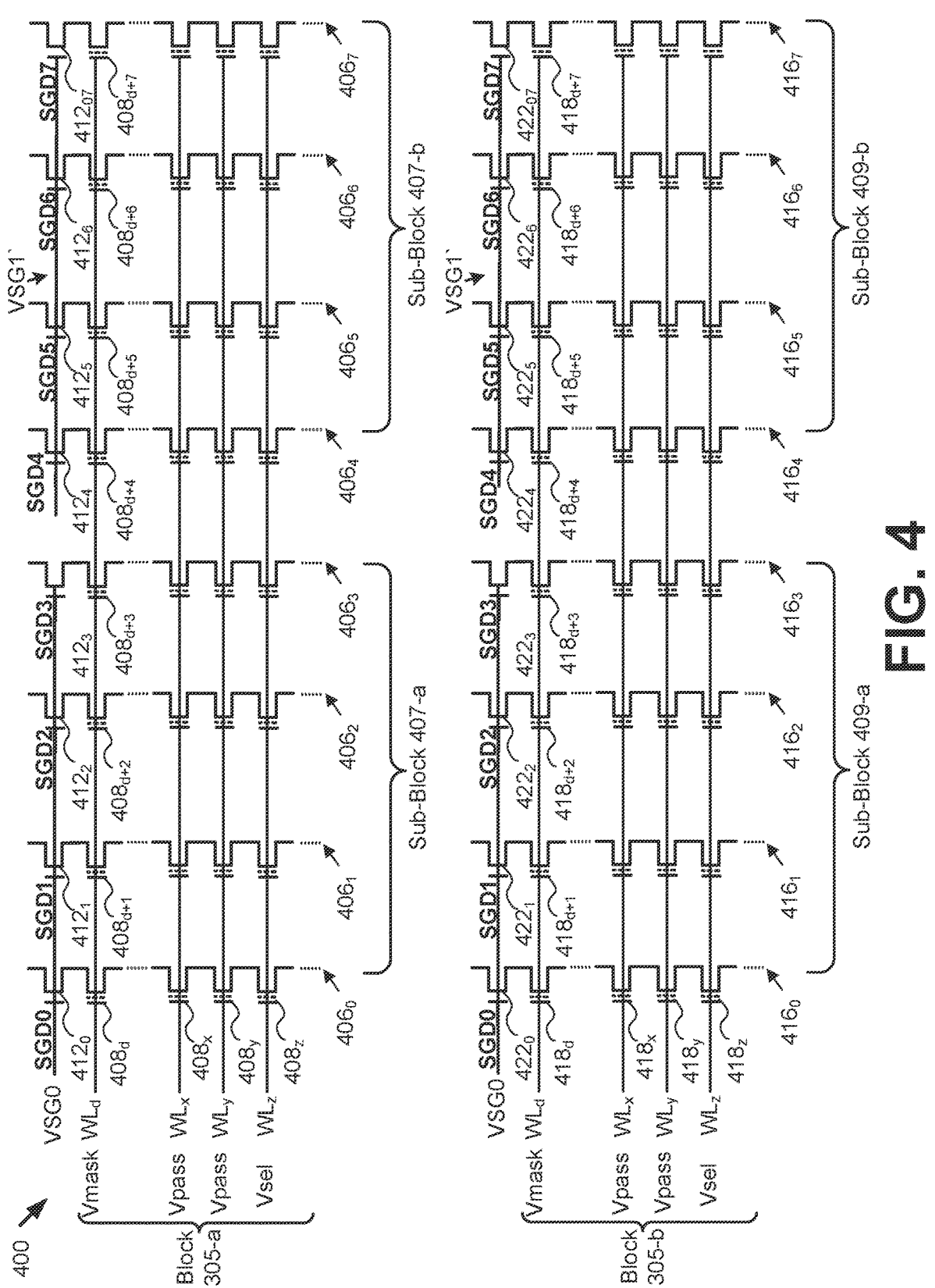
FIG. 4 is a schematic of portions of an array of memory cells implementing a concurrent scan operation on multiple blocks in a memory device, in accordance with embodiments of the present disclosure.

FIG. 4 is a detailed schematic of portions of an array of memory cells implementing a concurrent scan operation on multiple blocks in a memory device. The portion of the array of memory cells, such as memory array 104, can be a plane 400 for example. In one embodiment, the plane 400 includes blocks 305 that are coupled to a page buffer as described with reference to FIG. 3. The blocks 305 can include a dummy word line (WL$_d$), unselected word lines WL$_x$ and WL$_y$ (e.g., word lines not associated with the scan operation), and selected word lines W$_z$ (e.g., word lines associated with the scan operation). Each block 305 can include sub-blocks—e.g., sub-blocks 407 or sub-blocks 409. In one embodiment, each sub-block can include strings of memory cells 406 or strings of memory cells 416. Other numbers of sub-blocks can be included in other embodiments. The number of strings of memory cells in a sub-block can vary in other embodiments.

Specifically, in at least some embodiments, a first sub-block 407-$a$ of block 305-$a$ can include string of memory cells 406$_0$ through 406$_3$ each having a first drain select (SGD) 412 coupled to a string of memory cells 406. By way of example, the sub-block 407-$a$ can include a first string of memory cells 406$_0$ coupled to a first drain select (SGD) transistor 412$_0$. By way of example, the first string of memory cells 406$_0$ includes multiple memory cells (e.g., transistors) 409, including a dummy memory cells (e.g., transistor) 408$_d$. In some embodiments, transistors 408$_d$ (e.g., 408$_d$, 408$_{d+1}$, 408$_{d+2}$, etc.) can be dummy memory cells that do not store any user data as described with reference to FIG. 3. In some embodiments, a respective VSG line activates the SGDs in a sub-block—e.g., VSG0 activates SGDs in the first sub-block 407. The block 305 can further include additional sub-blocks. For example, second sub-block 407-*b* of block 305-*a* can include string of memory cells $406_4$ through $406_7$ each having a first drain select (SGD) 412 coupled to a string of memory cells 406. The plane 400 can include a second block 305-*b*. In some embodiments, the second block 305-*b* can include sub-blocks 409-*a* and 409-*b*. In some embodiments, each sub-block 409 can include strings of memory cells 416 with transistors 418 coupled to a dummy word line $WL_d$ that do not store data as described with reference to FIG. 3.

In some embodiments, each string of memory cells 406 and 416 in respective sub-blocks 407-*a* and 407-*b* can be coupled with a different sense amplifier of a set of amplifiers common to the plane 400. For example, string of memory cells $406_0$ can be coupled with a first sense amplifier, string of memory cells $406_1$ can be coupled with a second sense amplifier, string of memory cells $406_2$ can be coupled with a third sense amplifier, and string of memory cells $406_3$ can be coupled with a fourth sense amplifier. In some embodiments, strings of memory cells in the same position in the sub-block can be coupled to the same sense amplifier. By way of example, string of memory cells $406_0$, string of memory cells $406_4$, string of memory cells $416_0$, and string of memory cells $416_4$ can all be coupled with the first sense amplifier while string of memory cells $406_1$, string of memory cells $406_5$, string of memory cells $416_1$, and string of memory cells $416_5$ can all be coupled with the second sense amplifier. Accordingly, to perform a concurrent scan operation, the local media controller 135 can cause selective transistors 408a to be programmed to a low threshold voltage such that a single string of memory cells of the string of memory cells sharing a common position is coupled to the sense amplifier when the scan operation is executed. For example, the local media controller 135 can cause a low threshold voltage to be applied to transistors $408_d$ and $418_{d+1}$ while causing a high threshold voltage to be applied to the remaining transistors 408 and 418 coupled to the dummy word line $WL_d$.

In some embodiments, local media controller 135 can perform a concurrent scan operation as described with reference to FIG. 3. For example, the local media controller 135 can select the block 305-*a* and block 305-*b* for a concurrent scan operation. In some embodiments, the local media controller can further select the sub-block 407-*a* and sub-block 409-*a* for the scan operation—e.g., the local media controller 135 can determine reliability of blocks 305 by scanning one sub-block as each sub-block of the block 305 faces the same stress (e.g., temperature). In such embodiments, the local media controller can cause a VSG high voltage to be applied to VSG0 of sub-block 407-*a* and 409-*a* to activate both sub-blocks and cause a VSG low voltage to be applied to VSG1 of sub-block 407-*b* and 409-*b* to deactivate both sub-blocks. The local media controller 135 can then apply a Vmask voltage to the dummy word lines $WL_d$ to activate transistor 408 and 418 programmed to the low threshold voltage—e.g., $408_d$ and $418_{d+1}$ In some embodiments, the Vmask voltage can also cause the remaining transistors 408 and 418 to remain deactivated. Accordingly, the local media controller 135 can cause the string of memory cells $406_0$ to be coupled to the first sense amplifier and the string of memory cells $416_1$ to be coupled to the second amplifier while the remaining string of memory cells 406 and 416 remain decoupled from the set of sense amplifiers. In some embodiments, the local media controller 135 can also cause a Vpass voltage to be applied to unselected word lines (e.g., unselected word lines $WL_x$ and $WL_y$) to allow memory cells 408 coupled to the unselected word lines to pass data—e.g., enable memory cells $408_x$ and $408_y$ to pass data from read from memory cell $408_z$ along the string of memory cells $406_0$ towards SGD0. In some embodiments, the local media controller 135 can then apply a Vselect voltage to the selected word lines WL to select memory cells 408 coupled to the selected word line $WL_z$. In some embodiments, the data from respective memory cells 408 and 418 in strings of memory cells 406 and 416 including the transistors 408 programmed to the low threshold voltage can be read to the sense amplifiers responsive to the Vselect voltage being applied—e.g., data from memory cell $408_z$ and memory cell $418_{z+1}$ can be read to the first sense amplifier and second amplifier respectively. Accordingly, the local media controller 135 can perform a concurrent scan operation across multiple blocks and improve the performance of the memory device.

Figure 5:
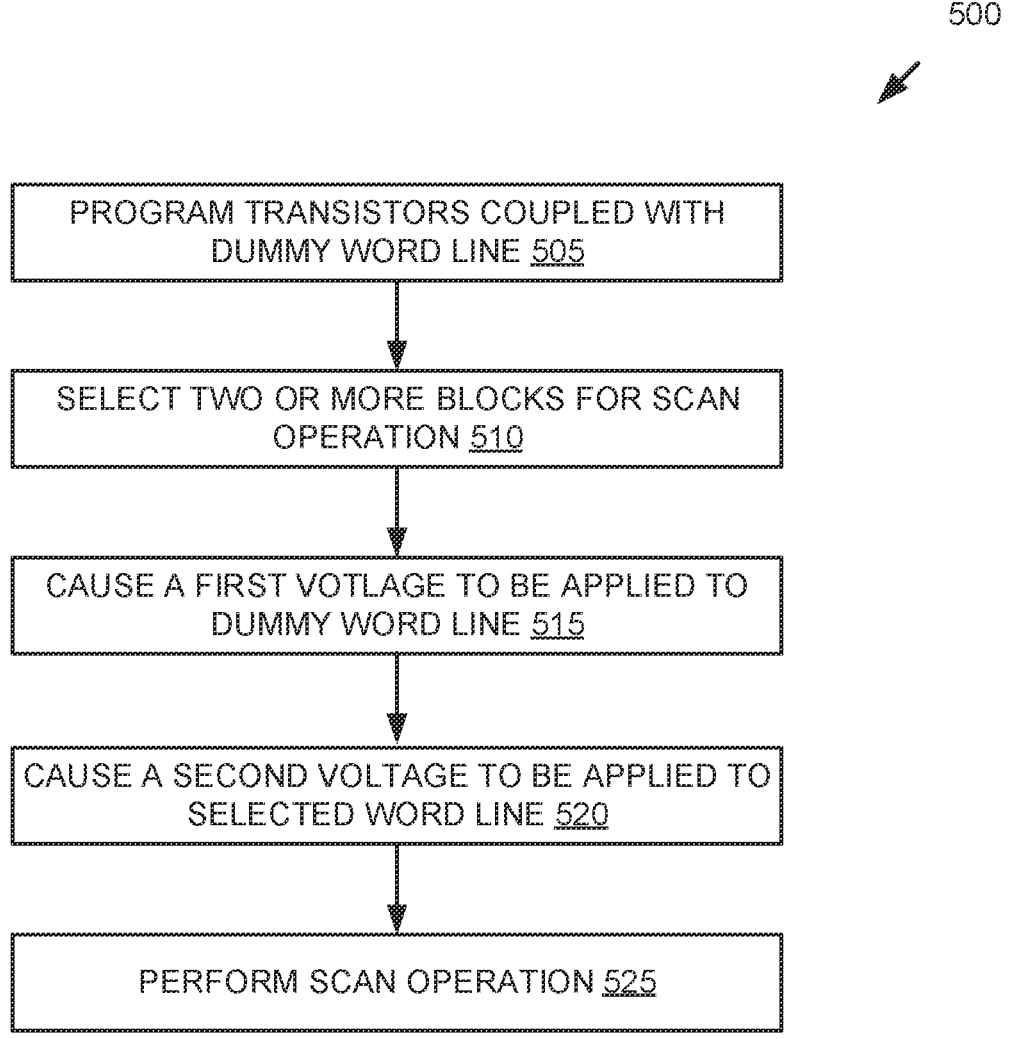
FIG. 5 is a flow diagram of an example method of a concurrent scan operation on multiple blocks in a memory device, in accordance with some embodiments of the present disclosure.

FIG. 5 is a flow diagram of an example method 500 for a concurrent scan operation on multiple blocks in a memory device, in accordance with the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, transistors coupled with a dummy word line are selectively programmed. For example, the processing logic (e.g., local media controller 135) can cause a selective transistor coupled to each dummy word line of a set of blocks (e.g., of two or more blocks) of a plurality of blocks in a memory array to be programmed to a low voltage threshold—e.g., cause a transistor of a string of memory cells to be programmed to the low threshold voltage (e.g., first threshold voltage). In some embodiments, the processing logic can cause a remaining number of transistors coupled to the dummy word line to be programmed to a high threshold voltage—e.g., cause a transistor of each of the remaining string of memory cells to be programmed to a high threshold voltage (e.g., second threshold voltage). In some embodiments, the second threshold voltage can be greater than the first threshold voltage. In some embodiments, the dummy word line can be coupled with transistors that do not store data—e.g., the processing logic can refrain from causing the transistors to be programmed with data. In some embodiments, the processing logic can program the transistors coupled to the dummy word lines in a non-overlapping fashion as described with reference to FIGS. 3 and 4. That is, the processing logic can cause each sense amplifier of the set of amplifiers to be coupled with a single string of memory cell that includes a transistor programmed to the low threshold voltage—e.g., so each sense amplifier can be coupled with a single sense component during the scan operation—e.g., an operation associated with determining one or more errors associated with storing data at each block of the plurality of blocks. In some embodiments, the processing logic can program the transistors in accordance with an erase algorithm during an erase operation. In other embodiments, the processing logic can program the transistors during a program operation or during the manufacturing process.

At operation 510, two or more blocks can be selected. For example, the processing logic can select two or more blocks from the plurality of blocks in the memory array for a concurrent scan operation. In at least one embodiment, the processing logic can select a number of blocks for the concurrent scan operation corresponding to a number of logical segments of a page buffer comprising the set of sense amplifiers as described with reference to FIG. 3—e.g., the processing logic can select four (4) blocks if the page buffer is divided into four (4) logical segments or 16 blocks if the page buffer is divided into 16 logical segments.

At operation 515, a first voltage can be applied to a dummy word line. For example, the processing logic can cause the first voltage to be applied to each dummy word line of the two or more blocks. In some embodiments, the first voltage can be a Vmask (or mask voltage) as described with reference to FIGS. 3 and 4. In one embodiment, the first voltage can have a magnitude between the low threshold and high threshold—e.g., between the first voltage threshold and the second voltage threshold. In some embodiments, the first voltage can selectively activate transistors of the string of memory cells—e.g., activate the transistors programmed to the first threshold voltage. In at least one embodiment, the first voltage can selectively deactivate (or keep deactivated) the remaining transistors of the remaining strings of memory cells—e.g., deactivate the transistors programmed to the second threshold voltage. In some embodiments, applying the first voltage (e.g., selectively activating the transistors) can couple the respective strings of memory cells with a sense amplifier of the set of sense amplifiers—e.g., selectively couple the string of memory cells in each block of the two or more blocks to a different sense amplifier. For example, the processing logic can cause a first string of memory cells in a first block to couple with a first sense amplifier and couple a second set of memory cells in a second block with a second sense amplifier responsive to causing the first voltage to be applied to the dummy word line. In at least one embodiment, the processing logic can cause a third string of memory cells in the first block to decouple from the second sense amplifier and a fourth string of memory cells in the second block to decouple from the first sense amplifier responsive to applying the first voltage.

At operation 520, a second voltage can be applied to a selected word line. For example, the processing logic can cause the second voltage to be applied to the selected word line of each block of the two or more blocks. In some embodiments, applying the second voltage can cause a bit stored at a respective memory cell of the string of memory cells (e.g., the strings of memory cells including the transistor programmed to the low threshold voltage and/or the string of memory cells coupled with the sense amplifier) to be read to the set of sense amplifiers. In some embodiments, each respective memory cell can be read to a different sense amplifier of the set of amplifiers as described with reference to FIGS. 3 and 4.

At operation 525, the scan operation can be performed. For example, the processing logic can perform the scan operation. In some embodiments, the processing logic can use the bits read from the respective memory cells to determine one or more errors with the data stored at the two or more blocks—e.g., determine a reliability of the data by counting a number of bits that flipped logic states (e.g., flipped from a '1' to a '0' or a '0' to a '1'). In some embodiments, the processing logic can perform the scan operation by determining an error rate associated with the two or more blocks. In some embodiments, the processing logic can perform the scan operation by calibrating the two or more blocks after determining the one or more errors or the error rate. For example, the processing logic can calibrate a demarcation voltage applied to read the memory cells of the blocks based on a shift of a voltage threshold distribution of associated with the memory cells. By performing the concurrent scan operation, the processing logic can reduce a time to perform the scan operation and improve performance of the scan operation.

Figure 6:
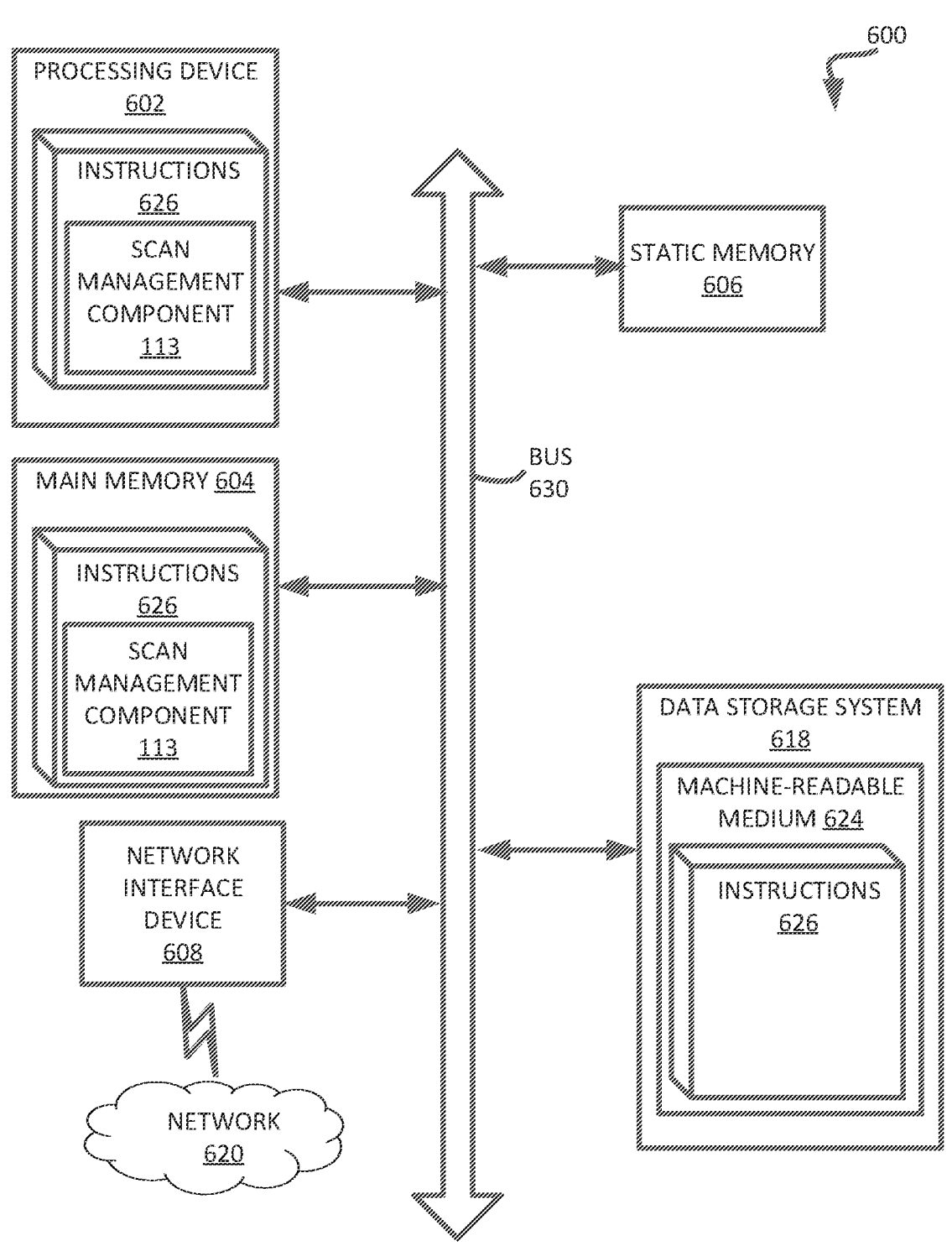
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the scan management component 113 of FIG. 1 to perform a scan operation). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 404 can correspond to the memory sub-system 110 of FIG. 1.

In one embodiment, the instructions 626 include instructions to implement functionality corresponding to a scan management component 113 to perform a program operation for the processing device 602. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:

a memory array comprising a plurality of blocks coupled to a set of sense amplifiers and a page buffer, each block of the plurality of blocks comprising a plurality of wordlines, wherein the memory array comprises a plurality of strings of memory cells spanning the plurality of blocks, and wherein each string of memory cells is associated with a respective sense amplifier and a respective logical segment of the page buffer; and control logic, operatively coupled with the memory array, to perform operations comprising:

selecting two or more blocks of the plurality of blocks to concurrently scan during a scan operation to determine a reliability of data stored in the two or more blocks, wherein respective dummy wordlines in the two or more blocks comprise transistors programmed in a staggered pattern, wherein one transistor associated with the dummy wordline in each block is programmed to a first threshold voltage and one or more remaining transistors associated with the dummy wordline in each block are programmed to a second threshold voltage that is higher than the first threshold voltage, and wherein the transistor programmed to the first threshold voltage is in a different string of memory cells and is associated with a different logical segment of the page buffer in each block;

causing a first voltage to be applied to the respective dummy wordlines in the two or more blocks to selectively couple a string of memory cells in each block of the two or more blocks to a different sense amplifier of the set of sense amplifiers to enable concurrent reliability scanning of the two or more blocks;

causing a second voltage to be applied to a selected word line of each block of the two or more blocks to read a bit stored at a respective memory cell of the string of memory cells in each block out to the set of sense amplifiers, wherein the bits from respective memory cells in each of the two or more blocks are read concurrently; and determining a scan result based on the concurrently read bits, wherein determining the scan result comprises determining one or more errors associated with storing data at the two or more blocks and calibrating the two or more blocks based on determining the one or more errors.

2. The memory device of claim 1, wherein the first voltage couples a first string of memory cells in a first block of the two or more blocks with a first sense amplifier of the set of amplifiers and couples a second string of memory cells in a second block of the two or more blocks with a second sense amplifier of the set of sense amplifiers.

3. The memory device of claim 2, wherein the first voltage decouples a third string of memory cells in the first block from the second sense amplifier of the set of amplifiers and decouples a fourth string of memory cells in the second block from the first sense amplifier of the set of amplifiers.

4. The memory device of claim 1, wherein each dummy word line is coupled to a plurality of strings of memory cells, and wherein the first voltage activates a transistor of the string of memory cells of the plurality of strings of memory cells to couple the string of memory cells to the respective sense amplifier.

5. The memory device of claim 4, wherein the first voltage deactivates a transistor of each remaining string of memory cells of the plurality of strings of memory cells to decouple the remaining strings of memory cells from the set of sense amplifiers.

6. The memory device of claim 5, wherein the transistor of the string of memory cells is programmed to a first threshold voltage and each transistor of the remaining strings of memory cells is programmed to a second threshold voltage greater than the first threshold voltage.

7. The memory device of claim 6, wherein the control logic is to further perform operations comprising:

programming the transistor of the string of memory cells to the first threshold voltage and each transistor of the remaining strings of memory cells to the second threshold voltage according to an erase algorithm before selecting the two or more blocks.

8. The memory device of claim 1, wherein a number of blocks selected from the plurality of blocks for the concurrent scan corresponds to a number of logical segments of the page buffer comprising the set of sense amplifiers.

9. A method, comprising:

selecting two or more blocks of a plurality of blocks in a memory array to concurrently scan during a scan operation to determine a reliability of data stored in the two or more blocks, the memory array comprising the plurality of blocks coupled to a set of sense amplifiers and a page buffer, each block of the plurality of blocks comprising a plurality of wordlines, wherein the memory array comprises a plurality of strings of memory cells spanning the plurality of blocks, and wherein each string of memory cells is associated with a respective sense amplifier and a respective logical segment of the page buffer, wherein respective dummy wordlines in the two or more blocks comprise transistors programmed in a staggered pattern, wherein one transistor in each block is programmed to a first threshold voltage and one or more remaining transistors in each block are programmed to a second threshold voltage that is higher than the first threshold voltage, and wherein the transistor programmed to the first threshold voltage is associated with a different logical segment of a page buffer and a different dummy wordline in each block;

causing a first voltage to be applied to the respective dummy wordlines in the two or more blocks to selectively couple a string of memory cells in each block of the two or more blocks to a different sense amplifier of the set of sense amplifiers to enable concurrent reliability scanning of the two or more blocks;

causing a second voltage to be applied to a selected word line of each block of the two or more blocks to read a bit stored at a respective memory cell of the string of memory cells in each block out to the set of sense amplifiers, wherein the bits from respective memory cells in each of the two or more blocks are read concurrently; and determining a scan result based on the concurrently read bits, wherein determining the scan result comprises determining one or more errors associated with storing data at the two or more blocks and calibrating the two or more blocks based on determining the one or more errors.

10. The method of claim 9, wherein the first voltage couples a first string of memory cells in a first block of the two or more blocks with a first sense amplifier of the set of amplifiers and couples a second string of memory cells in a second block of the two or more blocks with a second sense amplifier of the set of sense amplifiers.

11. The method of claim 10, wherein the first voltage decouples a third string of memory cells in the first block from the second sense amplifier of the set of amplifiers and decouples a fourth string of memory cells in the second block from the first sense amplifier of the set of amplifiers.

12. The method of claim 9, wherein each dummy word line is coupled to a plurality of strings of memory cells, and wherein the first voltage activates a transistor of the string of memory cells of the plurality of strings of memory cells to couple the string of memory cells to the respective sense amplifier.

13. The method of claim 12, wherein the first voltage deactivates a transistor of each remaining string of memory cells of the plurality of strings of memory cells to decouple the remaining strings of memory cells from the set of sense amplifiers.

14. The method of claim 13, wherein the transistor of the string of memory cells is programmed to a first threshold voltage and each transistor of the remaining strings of memory cells is programmed to a second threshold voltage greater than the first threshold voltage.

15. The method of claim 14, further comprising:

programming the transistor of the string of memory cells to the first threshold voltage and each transistor of the remaining strings of memory cells to the second threshold voltage according to an erase algorithm before selecting the two or more blocks.

16. The method of claim 9, wherein a number of blocks selected from the plurality of blocks for the concurrent scan corresponds to a number of logical segments of the page buffer comprising the set of sense amplifiers.

US 12,614,583 B2

25

17. A memory device comprising:
a memory array comprising a plurality of blocks coupled
to a set of sense amplifiers and a page buffer, wherein
each block comprises a respective dummy word line
coupled with a plurality of strings of memory cells, and
wherein each string of memory cells of the plurality of
strings of memory cells comprises a transistor coupled
with a respective sense amplifier of the set of sense
amplifiers and is associated with a respective logical
segment of the page buffer; and
control logic, operatively coupled with the memory array,
to perform operations comprising:
selecting two or more blocks of the plurality of blocks
to concurrently scan during a scan operation to
determine a reliability of data stored in the two or
more blocks, wherein the respective dummy word
lines in the two or more blocks comprise transistors
programmed in a staggered pattern, wherein one
transistor associated with the dummy wordline in
each block is programmed to a first threshold voltage
and one or more remaining transistors associated
with the dummy wordline in each block are pro-
grammed to a second threshold voltage that is higher
than the first threshold voltage, and wherein the
transistor programmed to the first threshold voltage
is in a different string of memory cells and is
associated with a different logical segment of the
page buffer in each block;
causing a first voltage to be applied to the respective
dummy word line of each block to selectively acti-
vate a transistor of a string of memory cells in each
block of the two or more blocks and couple respective strings of memory cells to respective sense
amplifier of the set of sense amplifiers, the strings of
memory cells in each block coupled to a different
respective sense amplifier of the set of amplifiers to
enable concurrent reliability scanning of the two or
more blocks;
causing a second voltage to be applied to a selected
word line coupled to the plurality of strings of
memory cells in each block of the two or more
blocks to read a bit stored at a respective memory
cell of a respective string of memory cells in each
block out to the respective sense amplifiers of set of
sense amplifiers, wherein the bits from respective
memory cells in each of the two or more blocks are
read concurrently; and
determining a scan result based on the concurrently
read bits, wherein determining the scan result com-
prises determining one or more errors associated
with storing data at the two or more blocks and
calibrating the two or more blocks based on deter-
mining the one or more errors.

18. The memory device of claim 17, wherein the respec-
tive string of memory cells of a first block of the two or more
blocks is coupled with a first sense amplifier of the set of
sense amplifiers and the respective string of memory cells of
a second block of the two or more blocks is coupled with a
second sense amplifier of the set of sense amplifiers.

19. The memory device of claim 17, wherein the control
logic refrains from causing data to be programmed to the
transistors coupled with the dummy word line.

* * * * *